(12) United States Patent
Peterson

(10) Patent No.: US 6,341,046 B1
(45) Date of Patent: Jan. 22, 2002

(54) CURRENT BIASING VOLTAGE SENSING PREAMPLIFIER FOR MAGNETORESISTIVE HEADS

(75) Inventor: Douglas R. Peterson, Minnetonka, MN (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 08/422,440

(22) Filed: Apr. 14, 1995

(51) Int. Cl.[7] ................................................. G11B 5/02
(52) U.S. Cl. ............................................ 360/67; 360/66
(58) Field of Search ...................................... 360/66, 67

(56) References Cited

U.S. PATENT DOCUMENTS 5,103,353 A * 4/1992 Jove et al. ...................... 360/67
5,327,303 A * 7/1994 Smith ............................. 360/67

* cited by examiner

*Primary Examiner*—Alan T. Faber
(74) *Attorney, Agent, or Firm*—Kinney & Lange

(57) ABSTRACT

A preamplifier for an MR element having first and second ends includes first and second feedback loops controlling the biasing of the MR element. The first feedback loop responds to a center voltage of the MR element to control a current source coupled to the first end of the MR element, and the second feedback loop responds to an output voltage across the MR element to control a current sink coupled to the second end of the MR element. In one embodiment, the preamplifier includes a multiplexer coupled between first and second MR elements and the first and second feedback loops. The multiplexer electrically isolates the first and second MR elements to improve common-mode rejection and feedback performance of the preamplifier.

1 Claim, 7 Drawing Sheets

CURRENT BIASING VOLTAGE SENSING PREAMPLIFIER FOR MAGNETORESISTIVE HEADS

BACKGROUND OF THE INVENTION

The present invention pertains to preamplifiers for magnetoresistive elements. Specifically, it pertains to a preamplifier having a programmable bias reference current, electrical isolation among a plurality of multiplexed elements, and improved feedback control of a bias current source.

Magnetoresistive (MR) elements are especially useful in MR heads for reading high-density binary data stored on magnetic media. The resistance of MR elements depends on the magnitude and direction of an applied magnetic field. Hence, the resistance of an MR element changes as the magnetic field of an adjacent magnetic medium moves relative to the element. When the element is properly coupled to an amplifier, the amplifier senses, or detects, the resistance of the element as a voltage or current signal corresponding to the magnetic field of the medium. Other circuitry may then decode the signal to retrieve the stored data.

The resistance changes of MR elements are generally nonlinear. Thus, to improve utility, it is common to electrically and magnetically bias an MR element to operate within an optimal range of its operating characteristic. Electrical biasing entails applying a voltage or current to the element to establish a steady-state, baseline resistance against which resistance changes induced by the magnetic medium may be reliably detected. Electrical biasing requires coupling the MR element to a preamplifier.

In its basic form, the preamplifier comprises a bias circuit, which sets the baseline resistance of the MR element, and a differential amplifier, which is parallel-coupled to the element. Although the bias circuit may be as simple as coupling the element between two voltage or current sources, it may also include a feedback control system. The feedback control system measures, or senses, either a voltage or current of the MR element indicating an actual bias condition, compares the measured voltage or current to a desired voltage or current reference representing a desired bias condition, and adjusts the bias voltage or current source to achieve the desired biasing. Using feedback is advantageous because it maintains the desired biasing as the element varies with temperature, age, and wear.

One type of preamplifier for MR heads uses a feedback bias circuit having a current-bias-voltage-sense (CBVS) architecture. The CBVS architecture signifies a feedback bias circuit which controls a bias current source by sensing a voltage of the MR element. In feedback terms, the preamplifier compares an actual head voltage to a desired voltage and adjusts a current source according to a difference between the actual and desired voltages. The CBVS architecture provides two important advantages over other feedback architectures.

One advantage stems from using voltage sensing instead of current sensing to control the biasing. Current-sensing circuitry monitors the bias status of the head by using two conductive leads to parallel-couple the sensing circuitry to the head. This arrangement, however, is problematic, because the two leads typically have a low input resistance and parasitic inductance which combine to introduce a low-frequency pole into the transfer function of the amplifier parallel-coupled to the head. The low-frequency pole reduces the bandwidth of the amplifier. Voltage sensing, on the other hand, avoids this problem because voltage-sensing circuitry has a high input resistance. The high input resistance of the voltage-sensing circuitry effectively isolates this circuitry from the amplifier, leaving the bandwidth of the amplifier intact.

The second advantage of the CBVS architecture arises from using current biasing rather than voltage biasing. Current biasing entails biasing the head between a pair of balanced current sources. In other words, one terminal of the head is coupled to the output of a current source and the other to the input of a current sink. This biasing scheme permits maintaining the head at an arbitrary voltage while voltage biasing does not. Preferably, the arbitrary voltage equals the voltage of the disc surface to prevent arcing between the head and disc. Arcing can occur when the element comes close to the disc, if the voltage difference between the disc and the head is sufficiently large. Specifically, where the disc and head are separated by less than 10 micro-inches, a voltage difference exceeding a few hundred millivolts may cause arcing. Thus, it is desirable to maintain equality of the head and disc voltages to eliminate the risk of arcing. Current biasing facilitates this effort.

U.S. Pat. No. 4,870,610, issued to Jove et al. (Jove), discloses a preamplifier implementing the CBVS architecture. FIG. 1 is a block diagram of the Jove preamplifier, showing an MR head $R_H$ biased between dependent current source $I_{BIAS}$ and independent current sink $I_{REF}$. A junction between equivalent resistors $R_1$ and $R_2$ derives a center voltage of head $R_H$. A differential feedback amplifier A, comparing the center voltage to a reference voltage $V_{REF}$, drives current source $I_{BIAS}$. Differential output amplifier B amplifies a voltage across the terminals of head $R_H$. The preamplifier maintains approximate equality of the center voltage of head $R_H$ and reference voltage $V_{REF}$ by varying the current output from source $I_{BIAS}$ around a quiescent reference current set by current sink $I_{REF}$. Accordingly, if head $R_H$ contacts or nearly contacts a magnetic disc having a potential equal to $V_{REF}$, the low voltage difference between the element and the disc prevents arcing. Moreover, resistors $R_1$ and $R_2$ have large resistances compared to head $R_H$, providing a high input resistance and effectively isolating the feedback loop from amplifier B. Thus, the Jove preamplifier provides the advantages of the CBVS architecture. It, however, is also beset by numerous problems.

One problem with the Jove preamplifier is that it does not permit programming the value of reference current sink $I_{REF}$. As shown in FIG. 1, current sink $I_{REF}$ is an independent current sink. As such, its level of current input is not directly adjustable, thereby limiting the flexibility of the bias circuit to respond to changing head conditions. Moreover, the ability to independently define this current is particularly important in transducers comprising a plurality of MR heads multiplexed to common bias circuitry. Heads inevitably differ; therefore, to ensure consistent biasing and performance of all heads, the bias current should be tailored to each head. Accordingly, providing a convenient means for programming, or adjusting, current sink $I_{REF}$ would advance the art.

Another problem with the Jove preamp arises from using it with a plurality of selectable, or multiplexed, MR heads. FIG. 2 shows the Jove preamp configured for two selectable MR heads. For sake of clarity, the biasing circuit comprising current source $I_{BIAS}$, current sink $I_{REF}$, differential amplifier A, and related switching transistors for coupling selectively to heads $R_{HA}$ $R_{HB}$ are not shown. In FIG. 2, two emitter-coupled differential transistor pairs $Q_{1A}$-$Q_{2A}$ and $Q_{1B}$-$Q_{2B}$ serve as output amplifiers for respective heads $R_{HA}$ $R_{HB}$. Transistors $Q_{1A}$ and $Q_{1B}$ and transistors $Q_{2A}$ and $Q_{2B}$ are parallel-coupled such that the emitters of transistors $Q_{1A}$ and $Q_{1B}$ are coupled to current source $I_1$ and to a first terminal of impedance $Z_E$, and the emitters of transistors $Q_{2A}$ and $Q_{2B}$ are coupled to current source $I_2$ and a second terminal of impedance $Z_E$. Thus, impedance $Z_E$, an emitter-coupling impedance, couples the emitters of transistors $Q_{1A}$ and $Q_{2A}$ and the emitters of transistors $Q_{1B}$ and $Q_{2B}$. The collectors of parallel-coupled transistors $Q_{1A}$ and $Q_{1B}$ and parallel-coupled transistors $Q_{2A}$ and $Q_{2B}$ are connected to voltage supply $V_{S1}$ (not shown) via respective resistors $R_{c1}$ and $R_{c2}$. The bases of transistor pair $Q_{1A}$-$Q_{2A}$ are connected to the first and second terminals of MR head $R_{HA}$, and the bases of transistor pair $Q_{1B}$-$Q_{2B}$ are connected similarly to MR head $R_{HA}$. Series resistor pairs $R_{1A}$-$R_2A$ and $R_{1B}$-$R_{2B}$ are coupled in parallel to respective heads $R_{HA}$ and $R_{HB}$. The two junctions formed between the resistors of resistor pairs $R_{1A}$-$R_{2A}$ and $R_{1B}$-$R_{2B}$ are coupled to a first input terminal of differential feedback amplifier A, thereby resistively coupling heads $R_{HA}$ and $R_{HB}$. A second input terminal of amplifier A is coupled to the reference voltage $V_{REF}$, and the output terminal of amplifier A is coupled to a control terminal of bias current source $I_{BIAS}$ (FIG. 1). The output of current source $I_{BIAS}$ is coupled selectively to the first terminals of respective heads $R_{HA}$ and $R_{HB}$ by a switch (not shown in FIG. 2), and the input of reference current sink $I_{REF}$ (not shown) is coupled selectively to the second terminal of head $R_{HA}$ or $R_{HB}$ by another switch (not shown).

The problem in using the Jove preamp with a plurality of multiplexed heads is that it poorly isolates a selected head from the remaining unselected heads, reducing the capacity of the preamp to reject common-mode signals and noise. To understand the problem, assume that reference voltage $V_{REF}$ equals ground potential, that the inputs of amplifier A are equal, that impedance $Z_E$ effectively shorts at the operating frequencies of interest, and that the first and second terminals of the selected head $R_{HA}$ have potentials of ±0.1 volts, respectively. Thus, the center voltage of head $R_{HA}$ is zero volts, and the base potentials of transistors $Q_{1A}$ and $Q_{1B}$ are also ±0.1 volts, respectively. Further assuming emitter-base-junction (EBJ) drops of 0.7 volts, transistors $Q_{1A}$ and $Q_{2A}$ have respective emitter potentials of −0.6 and −0.8 volts. Head $R_{HB}$, on the other hand, is decoupled from source $I_{BIAS}$ and sink $I_{REF}$, so it conducts no current. Because series resistor pair $R_{1B}$-$R_{2B}$ is still coupled to the first input terminal of amplifier A, resistor pair $R_{1B}$-$R_{2B}$ and head $R_{HB}$ are at zero volts. Consequently, transistor $Q_{2B}$ has a base potential of zero volts, which is 0.8 volts higher than its emitter potential of −0.8 volts. Hence, the EBJ of transistor $Q_{2B}$ is forward-biased, causing transistor $Q_{2B}$ to conduct current away from the collector of transistor $Q_{2A}$. The current transistor $Q_{2B}$ conducts away from transistor $Q_{2A}$ prevents the collector currents of transistors $Q_{1A}$ and $Q_{2A}$ from matching. Likewise, when head $R_{HB}$ is selected, the collector currents of transistors $Q_{1B}$ and $Q_{2B}$ will not match. Moreover, when more than two heads are multiplexed like heads $R_{HA}$ and $R_{HB}$, the current diverted from one side of a differential pair corresponding to a selected head increases proportionately. Hence, the severity of the current mismatch between the transistors of the differential pair will also increase.

The inability or failure to match these currents and the diversion of current degrades performance of the preamplifier in three ways. First, a mismatch between these currents introduces an offset voltage in the output of differential pair $Q_{1A}$-$Q_{2A}$ or $Q_{1B}$-$Q_{2B}$ The offset forces the differential pairs to misrepresent the AC voltage across heads $R_{HA}$ and $R_{HB}$. For example, if the terminal voltages of head $R_{HA}$ or $R_{HB}$ are equal, the output of the respective differential pair $Q_{1A}$-$Q_{2A}$ or $Q_{1B}$-$Q_{2B}$ would not be zero volts as it should be, but would be a finite voltage representing the current mismatch. Furthermore, minute variations among the differential transistors would change the offset from pair to pair, complicating any attempts to remove the offset. Second, the mismatch thwarts the ability of the differential pair to reject common-mode noise, i.e. noise appearing equally at the bases of the differential pair. Instead of rejecting common-mode noise as it would absent the mismatch, the Jove differential pair amplifies the noise, increasing the likelihood of misreading data from a magnetic medium. Moreover, since common-mode noise rejection would effectively reject any noise appearing equally at not only the bases of the differential pair, but also the emitters and collectors, the mismatch promotes other noise as well. For example, noise from the power supply inevitably modulates the current sources of the preamnplifier. Thus, noise in current sources $I_1$ and $I_2$ corrupts signals output by the preamplifier. In principle, good common-mode rejection would mute this noise. The current mismatch, however, prevents common-mode rejection, enabling noise from all sources to corrupt output signals and increase data-reading errors. Third, the mismatch, resulting from current being diverted from the differential pair, reduces the gain of the differential pair, i.e. the preamplifier gain. In particular, the gain of the preamplifier depends directly on the sum of the collector currents of the differential pair. Thus, because any diversion of current away from the pair reduces the sum of these currents, any diversion reduces preamplifier gain. Moreover, adding more heads further reduces preamplifier gun and common-mode rejection.

Another problem with the Jove preamp stems from its noisy bias current source and feedback loop. To better understand the problem, FIG. 3 illustrates the specific circuitry of the Jove feedback loop. As shown in FIG. 3, the feedback loop comprises a differential pair consisting of transistors $Q_6$ and $Q_7$, resistors $R_3$-$R_5$ diodes $D_1$ and $D_2$, current source $I_4$, capacitor $C_1$, and controlled current source $I_{BIAS}$ formed by Darlington-paire A transistors $Q_8$ and $Q_9$. Again, switching circuitry is not shown for sake of clarity. The bases of transistors $Q_6$ and $Q_7$ serve as respective first and second inputs of amplifier A while the collector of transistor $Q_6$ serves as the output terminal of amplifier A. In the feedback loop, a significant source of noise is the base shot noise of transistor $Q_9$. This shot noise shunts in part through the emitter of transistor $Q_8$. Transistor $Q_8$ has an emitter impedance that varies inversely with the transistor gain factor beta and directly with the sum of the small-signal emitter and base resistances $r_e$ and $r_b$ of transistor $Q_8$. Emitter resistance $r_e$ is negligible in comparison to base resistance $r_b$, and the base resistance, or reactance, $r_b$ depends inversely on capacitor $C_1$. Thus, to promote shunting, capacitor $C_1$ should be large. In the Jove preamp, however, capacitor $C_1$, an integrated capacitor, is maximally limited to about 50 picofarads. Therefore, if beta ranges from 50 to 200 and the preamp operates at one megahertz, capacitor $C_1$ (having a reactance of 3175 ohms) dictates an approximate shunting impedance ranging between 15 and 60 ohms. Such a range is too high to effectively shunt the base shot noise of transistor $Q_9$.

A further problem with the Jove preamp concerns its frequency response characteristics. Generally, feedback systems should have a high open-loop gain to minimize the magnitude of a steady-state error between an actual and a desired system output. High open-loop gains, however, diminish the phase margin, or stability, of a feedback system. In other words, although higher gains reduce the magnitude of the error in a feedback system, the reduction usually comes at the expense of stability. One way to buttress stability and still maintain high gain and low error is to adjust pole frequencies in the transfer function of the feedback system. Adjusting pole frequencies to increase stability is known as frequency compensation.

In Jove, the frequency response problem is two fold: one, the open-loop gain of the feedback loop is too low to adequately minimize error in the system and two, the gain that is present is undercompensated, leading to inadequate stability of the feedback loop. With respect to FIG. 3, performance of the circuit as a feedback amplifier is inadequate because the collectors of transistors $Q_6$ and $Q_7$ are not biased symmetrically, i.e. at the same voltage and current levels. Symmetrical biasing facilitates error minimization by enabling differential pair $Q_6$-$Q_7$ to respond to an actual difference between desired center voltage $V_{REF}$ and the actual center voltage input at the base of transistor $Q_7$. Asymmetrical, or mismatched, biasing causes differential pair $Q_6$-$Q_7$ to misperceive, or undervalue, the feedback error of the loop. The net effect of misperceiving the feedback error is to lessen the response of the feedback loop to the actual error, i.e. to reduce the gain of the loop. Second, the gain of the loop, controlled by resistors $R_3$ and $R_4$, remains insufficiently compensated to offset instability concerns. One reason for the higher than desirable gain (at least from a stability perspective) is the inadequate degeneration resistance provided by resistors $R_3$ and $R_4$. The bias voltage of resistors $R_3$ and $R_4$, fixed by current source $I_4$, frustrates the degenerative effect necessary to ensure a more stable feedback loop.

In sum, the Jove preamp is beset by numerous deficiencies. The present invention recognizes and addresses each of these and others not expressly detailed to provide an improved preamplifier having a programmable bias reference current, better isolation among multiple heads, a higher common-mode rejection ratio, and a more stable and efficient bias control system.

SUMMARY OF THE INVENTION

A preamplifier for an MR element having first and second ends comprises first and second feedback loops which control the biasing of the MR element. The first feedback loop responds to a center voltage of the MR element to control a current source coupled to the first end of the MR element, and the second feedback loop responds to an output voltage across the MR element to control a current sink coupled to the second end of the MR element.

In one embodiment, the preamplifier further comprises a multiplexer coupled between first and second MR elements and the first and second feedback loops. The multiplexer responds to a first input mode to couple the first center voltage to the first feedback loop and decouple the second center voltage from the first feedback loop and responds to a second input mode to couple the second center voltage to the first feedback loop and decouple the first center voltage from the first feedback loop.

In preferred embodiments, the first feedback loop includes a differential feedback amplifier, and the second feedback loop includes a differential-to-single-ended voltage converter. Preferably, the voltage converter comprises first and second opposing transconductance amplifiers.

According to one aspect of the present invention, the preamplifier biases the MR element by deriving a center voltage of the MR element and a signal based on a difference between the center voltage and a reference voltage. Using the difference signal, the preamplifier controls a current source coupled to a first end of the MR element. The output voltage of the MR element operates a controllable current sink coupled to the second end of the MR element.

According to another aspect of the present invention, the MR element provides a differential output voltage, which is converted to a single-ended voltage. A parallel circuit has first and second symmetrical branches coupled between first and second voltage sources. The differential output voltage drives a first transconductance amplifier to produce a voltage imbalance between the first and second symmetrical branches. A second transconductance amplifier operates according to the voltage imbalance to restore balance of the first and second symmetrical branches. A differential amplifier operates on the voltage imbalance to produce a single-ended voltage.

DETAILED DESCRIPTION OF THE PREFERRED EMBODIMENTS

Figure 4:
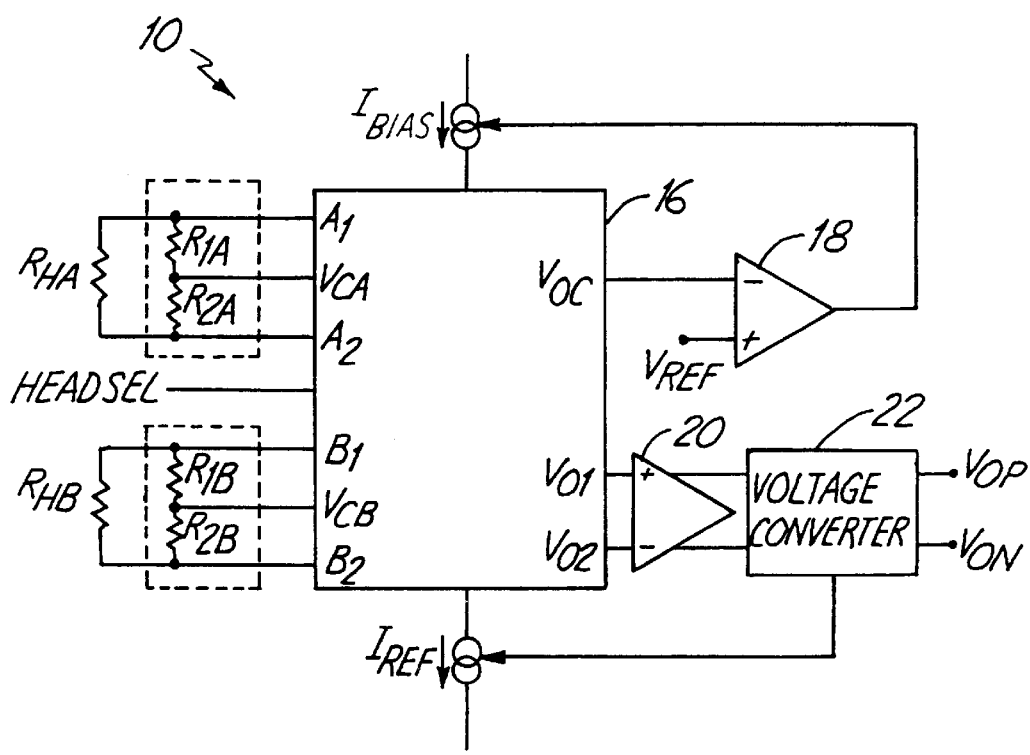
FIG. 4 is a block diagram illustrating a CBVS preamplifier according to the present invention.

FIG. 4 is a block diagram of preamplifier 10 according to the present invention. Preamplifier 10 comprises multiplexer 16, differential feedback amplifier 18, amplifier 20, current source $I_{BIAS}$, current sink $I_{REF}$, and differential-to-single-ended voltage converter 22. MR element $R_{HA}$ is connected in parallel to a series resistor combination consisting of resistors $R_{1A}$ and $R_{2A}$. A junction between resistors $R_{1A}$ and $R_{2A}$ is connected to an input terminal $V_{CA}$ of multiplexer 16 and serves as a center-voltage terminal of MR element $R_{HA}$. First and second terminals of MR element $R_{HA}$ are connected respectively to inputs $A_1$ and $A_2$ of multiplexer 16. MR element $R_{HB}$ is connected similarly to inputs $B_1$ and $B_2$ of multiplexer 16. Element $R_{1A}$ is connected in parallel to a series resistor combination $R_{1B}$-$R_{2B}$. A junction between resistors $R_{1B}$ and $R_{2B}$ forms a center-voltage terminal for element $R_{HB}$ and is connected to input $V_{CB}$ of multiplexer 16. Resistors $R_{1A}$, $R_{2A}$, $R_{1B}$, and $R_{2B}$ are equi-valued and large relative to the operative resistances of MR elements $R_{HA}$ and $R_{HB}$, setting a high input resistance and isolating the feedback loop from amplifier 20.

In addition to inputs $A_1$, $A_2$, $V_{CB}$, $B_1$, $B_2$, and $V_{CA}$, multiplexer 16 has input HEADSEL and outputs $V_{oc}$, $V_{o1}$, and $V_{o2}$. In operation, input HEADSEL causes multiplexer 16 to select MR head $R_{HA}$ or $R_{HB}$. Accordingly, multiplexer 16 switches bias current source $I_{BIAS}$ and reference current $I_{REF}$ to respective terminals $A_1$ and $A_2$ or $B_1$ and $B_2$ corresponding to the selected head. Multiplexer 16 also switches center-voltage input $V_{CA}$ or $V_{CB}$ to output center voltage $V_{OC}$ and terminals $A_1$ and $A_2$ or $B_1$ and $B_2$ to respective outputs $V_{O1}$ and $V_{O2}$.

Output center voltage $V_{OC}$ of multiplexer 16 is coupled to the negative input of feedback amplifier 18. The positive input of feedback amplifier 18 is coupled to reference voltage $V_{REF}$. The output of amplifier 18, representing a difference between output center voltage $V_{OC}$ and reference voltage $V_{REF}$, controls bias current source $I_{BIAS}$. Feedback amplifier 18 drives the center voltage of selected head $R_{HA}$ or $R_{HB}$ to the voltage fixed by reference voltage $V_{REF}$. Voltage $V_{REF}$ preferably matches the voltage of a magnetic disc used with preamplifier 10, thereby preventing arcing between the selected head and the disc. Amplifier 20 receives outputs $V_{o1}$ and $V_{o2}$, corresponding to the voltage across head $R_{HA}$ or $R_{HB}$, and produces a differential output voltage feeding voltage converter 22. Voltage converter 22 converts the differential output voltage of amplifier 20 to a single-ended output voltage $V_O$ used to set, or program, current sink $I_{REF}$.

Figure 5:
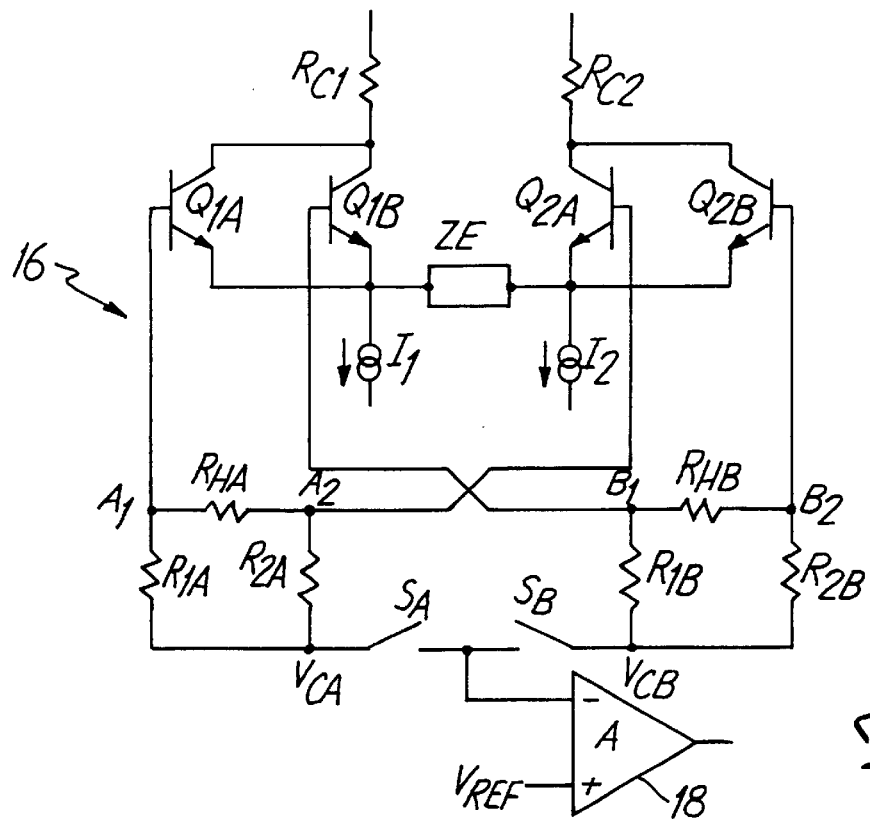
FIG. 5 is a schematic diagram showing a multiplexer used in the preamplifier of FIG. 4.

The switches of multiplexer 16 isolate heads $R_{HA}$ and $R_{HB}$ to overcome the common-mode rejection problem suffered by the preamplifier of the prior art. FIG. 5 illustrates details of multiplexer 16. Switches $S_A$ and $S_B$, shown in FIG. 5, selectively couple and decouple heads $R_{HA}$ and $R_{HB}$ from differential feedback amplifier 18. Accordingly, selecting head $R_{HA}$ prevents transistor $Q_{2B}$ from conducting current away from transistor $Q_{2A}$ as it did in the prior art. Specifically, switch $S_B$ decouples the base of transistor $Q_2i$, from the negative input of feedback amplifier 18, presenting a high impedance to the base and effectively reverse-biasing transistor $Q_{2B}$. Likewise, selecting head $R_{HB}$ reverse-biases transistor $Q_{1A}$, rendering it unable to conduct current away from transistor $Q_{1B}$ Consequently, the present invention provides a CBVS preamplifier having improved common-mode rejection and data detection accuracy.

Figure 6:
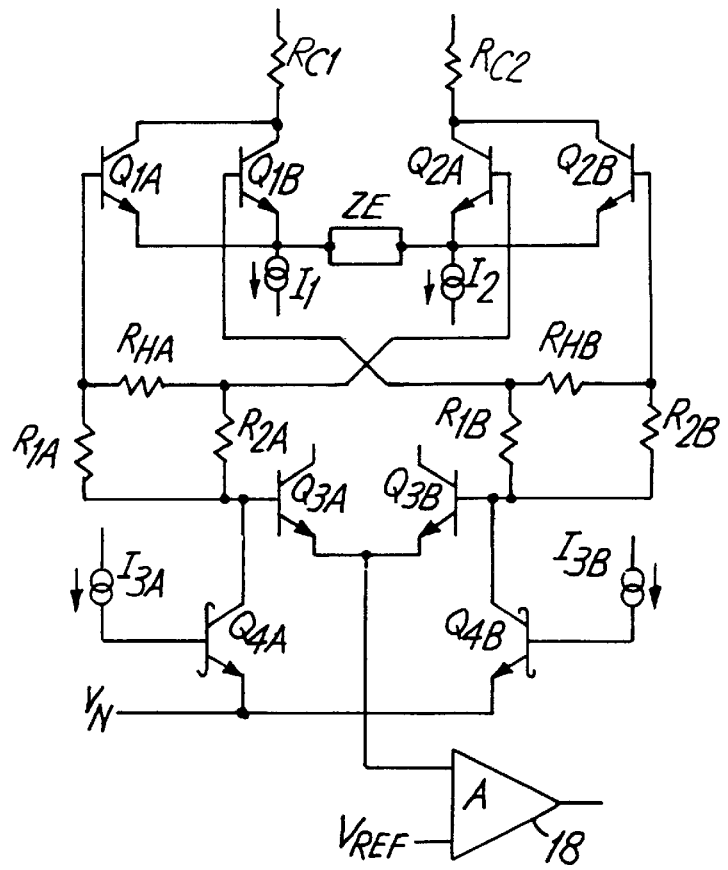
FIG. 6 is a schematic diagram illustrating a switching circuit used in the multiplexer of FIG. 5.

FIG. 6 shows how switches $S_A$ and $S_B$ may be implemented using transistors $Q_{3A}$, $Q_{3B}$, $Q_{4A}$, and $Q_{4B}$, current sources $I_{3A}$ and $I_{3B}$, and negative supply voltage $V_N$. Input HEADSEL selectively activates and deactivates current sources $I_{3A}$ and $I_{3B}$ Activating current source $I_{3A}$ saturates transistor $Q_{4A}$ which in turn deactivates transistor $Q_{3A}$, thereby isolating the center voltage of head $R_{HA}$ from amplifier A. Deactivating source $I_{3A}$ deactivates transistor $Q_{4A}$, allowing transistor $Q_{3A}$ to couple the center voltage to amplifier A. Current source $I_{3B}$ works similarly with respect to head $R_{HB}$.

Figure 7:
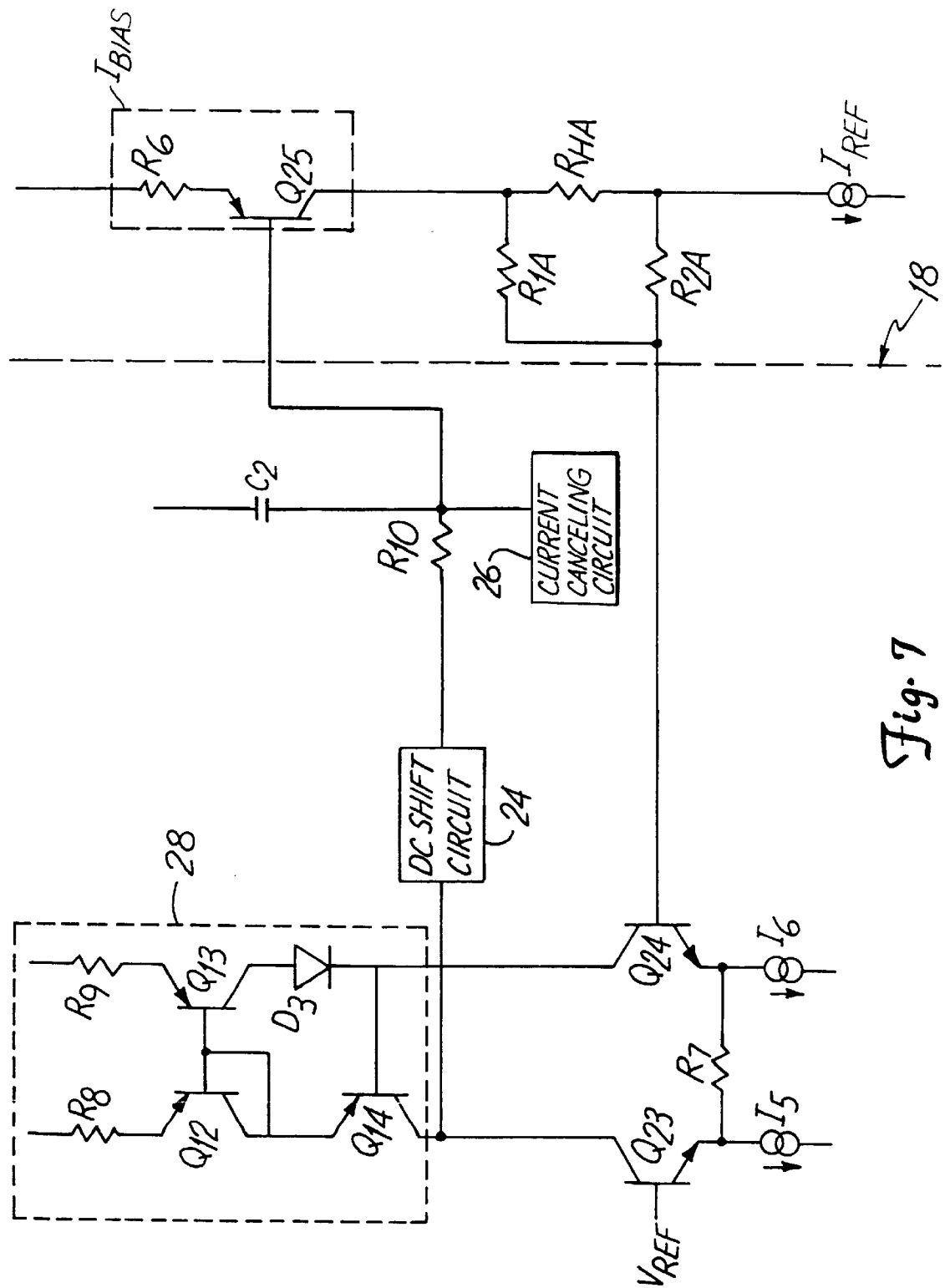
FIG. 7 is a schematic diagram of the differential feedback amplifier used in FIG. 4.

FIG. 7 is a schematic diagram of the presently preferred embodiment of differential feedback amplifier 18. The emitters of NPN transistors $Q_{23}$ and $Q_{24}$ are coupled to the respective first and second terminals of resistor $R_7$ and to respective current sources $I_5$ and $I_6$. The collector of transistor $Q_{23}$ is connected to the collector of PNP transistor $Q_{14}$ and to the input of DC shift circuit 24. The collector of transistor $Q_{24}$ is connected to a negative terminal of diode $D_3$ and to the base of transistor $Q_{14}$. The base of transistor $Q_{23}$ is connected to reference voltage $V_{REF}$, and the base of transistor $Q_{24}$ is connected either to center voltage $V_{CA}$ or $V_{CB}$ of head $R_{HA}$ or R., via output $V_{OC}$, according to input HEADSEL (FIG. 4). For sake of clarity, FIG. 7 omits the switching circuitry shown in FIG. 5, and by way of example, head $R_{HA}$ and associated resistors $R_{1A}$ and $R_{2A}$ are shown directly connected. Transistors $Q_{12}$-$Q_{14}$, resistors $R_8$ and $R_9$, and diode $D_3$ form active-load circuit 28. The emitter of PNP transistor $Q_{14}$ is connected to the collector and base of transistor $Q_{12}$ which has its emitter connected to voltage source $V_s$, (not shown) via resistor $R_8$. The respective base, collector, and emitter of PNP transistor $Q_{13}$ are connected to the base of transistor $Q_{12}$, a positive terminal of diode $D_3$, and voltage source $V_{S1}$ via resistor $R_9$. The output of shift circuit 24 is connected to the control terminal of current source $I_{BIAS}$ (formed by transistor $Q_{25}$ and resistor $R_6$) via resistor $R_{10}$. Capacitor $C_2$ is connected between voltage source $V_{S1}$ and current-canceling circuit 26. Circuit 26 is also coupled to the control terminal of current source $I_{BIAS}$ (i.e., the base of transistor $Q_{25}$).

Figure 8:
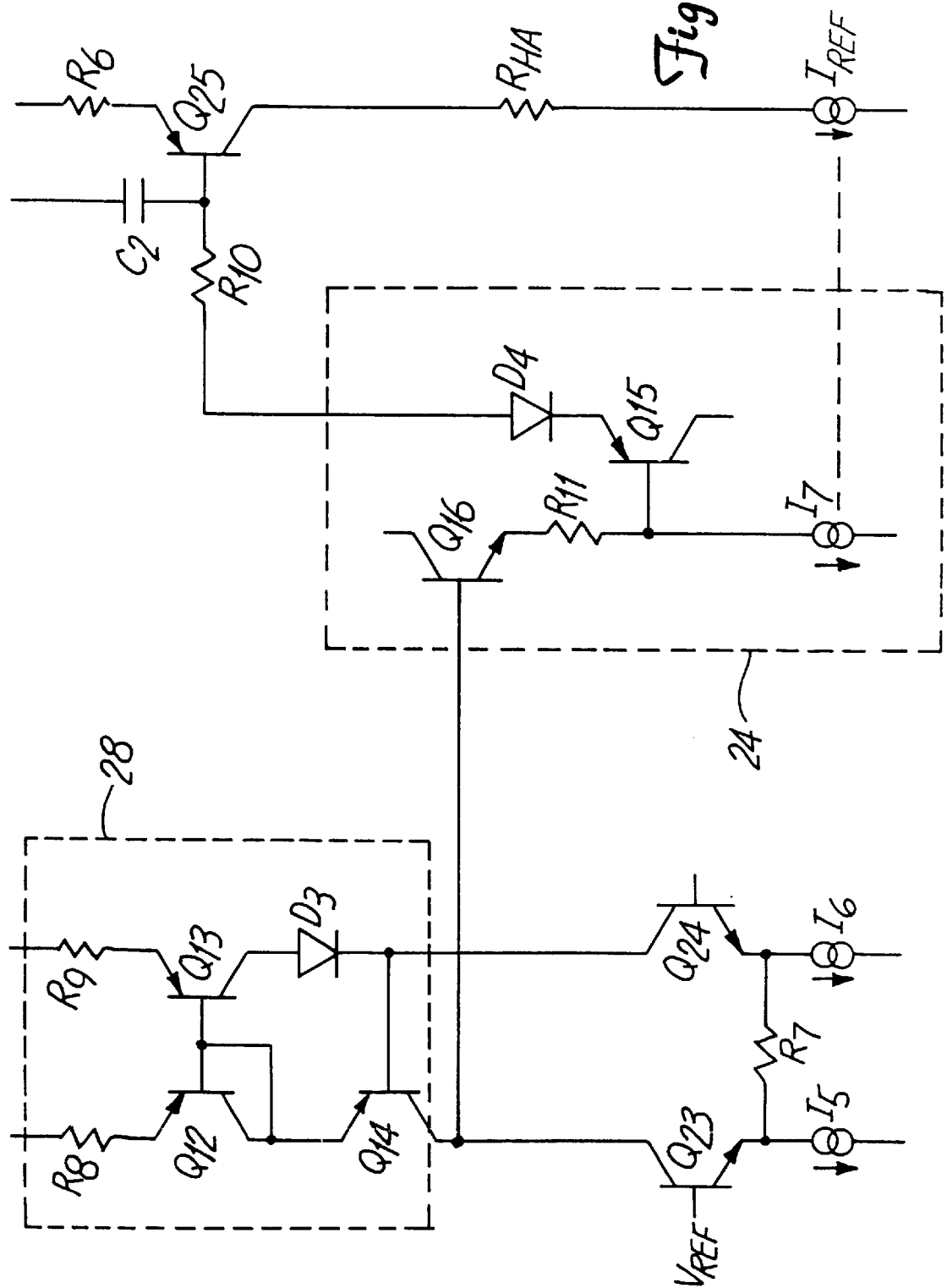
FIG. 8 is a schematic diagram of a DC shift circuit used in the differential feedback amplifier of FIG. 7.
Figure 9:
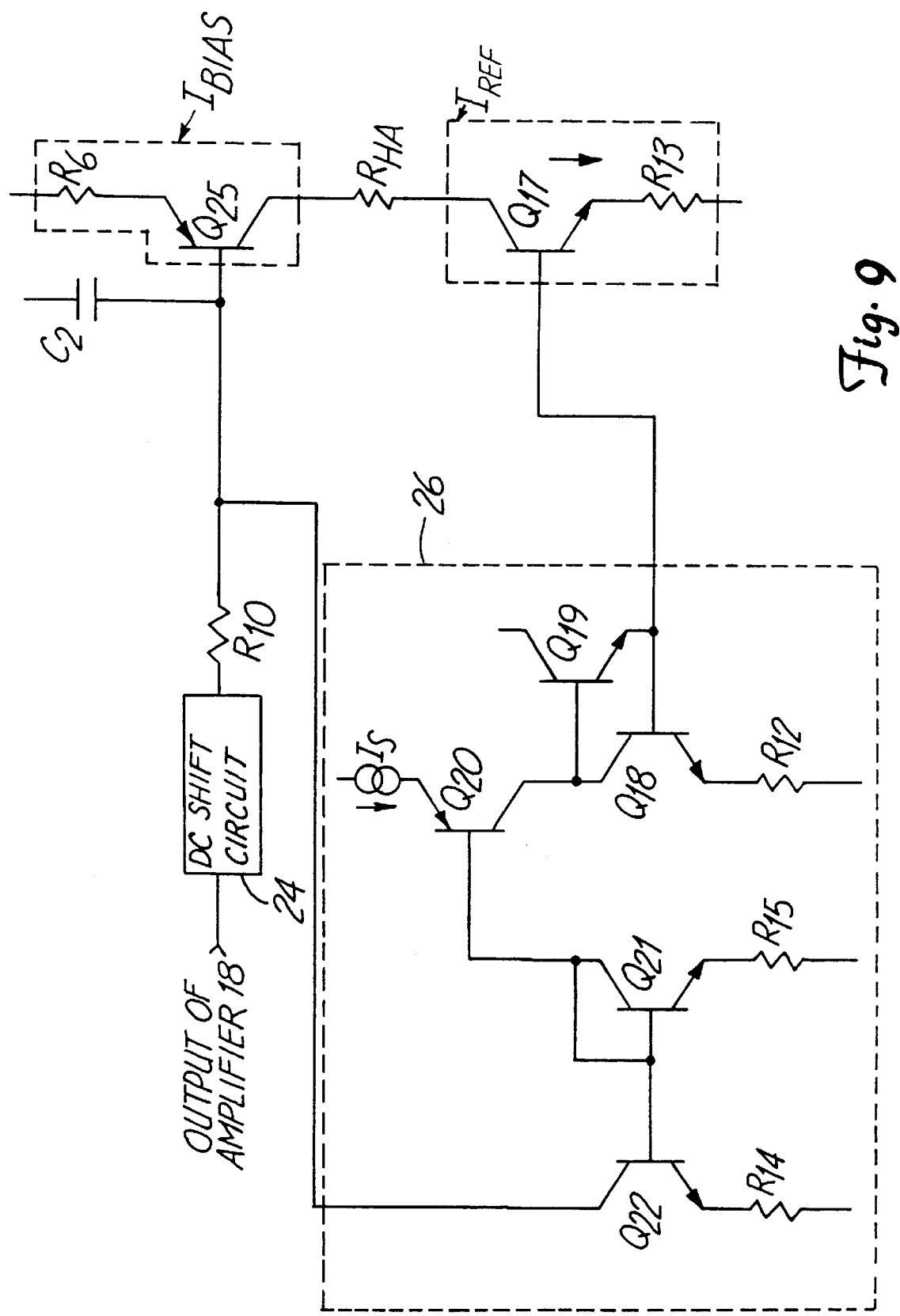
FIG. 9 is a schematic diagram of a current-canceling circuit used in the differential feedback amplifier of FIG. 7.

Detailed schematic diagrams of shift circuit 24 and current-canceling circuit 26 are shown in FIGS. 8 and 9, respectively. In FIG. 8, NPN transistor $Q_{16}$ is coupled between supply voltage $V_{S1}$ (not shown) and current source $I_7$; diode $D_4$ is coupled between resistor $R_{10}$ and the emitter of PNP transistor $Q_{15}$; and transistor $Q_{15}$ is coupled between diode $D_4$ and a negative supply voltage (not shown). Current source $I_7$ produces a current directly proportional to source $I_{REF}$ by a constant factor K. Resistor $R_{11}$ has a resistance equal to resistor $R_6$ divided by K. Because a current in resistor $R_{11}$ equals the current of source $I_7$, a voltage drop across resistor $R_{11}$ equals the voltage drop across resistor $R_6$. Thus, the collector voltage of transistor $Q_{23}$ is both independent of source $I_{REF}$ and equal to the collector voltage of transistor $Q_{24}$, thereby symmetrically biasing transistors $Q_{23}$ and $Q_{24}$ and providing superior feedback performance.

Shown in FIG. 9, current-canceling circuit 26 comprises a current source $I_s$, transistors $Q_{17}$-$Q_{22}$, and resistors $R_{12}$-$R_{15}$. Circuit 26 cancels the base current of PNP transistor $Q_{25}$. This current is proportional to current $I_{BIAS}$ which is approximately equal to current $I_{REF}$. Current $I_s$ generates current source $I_{REF}$ through a one-to-one current mirror consisting of transistors $Q_{17}$-$Q_{19}$ and resistors $R_{12}$ and $R_{13}$; so, currents $I_{REF}$ and $I_s$ are nearly equal. Since source $I_s$ sets the emitter current of PNP transistor $Q_{20}$, the base current of transistor $Q_{20}$ matches the base current of transistor $Q_{25}$. Thus, reflecting this base current using a second current mirror, comprising transistors $Q_{21}$ and $Q_{22}$ and resistors $R_{14}$ and $R_{15}$, to the base current of transistor $Q_{25}$ cancels the nearly equal and opposite base current of transistor $Q_{25}$. In sum, the current mirror comprising source $I_S$ and transistors $Q_{17}$-$Q_{19}$ produces current $I_{REF}$ and the current mirror comprising transistors $Q_{21}$ and $Q_{22}$ cancels the base current of transistor $Q_{25}$. Consequently, the DC voltage across resistor $R_{10}$, a large resistance, is approximately zero, thereby preserving linearity of the feedback loop.

Figure 1:
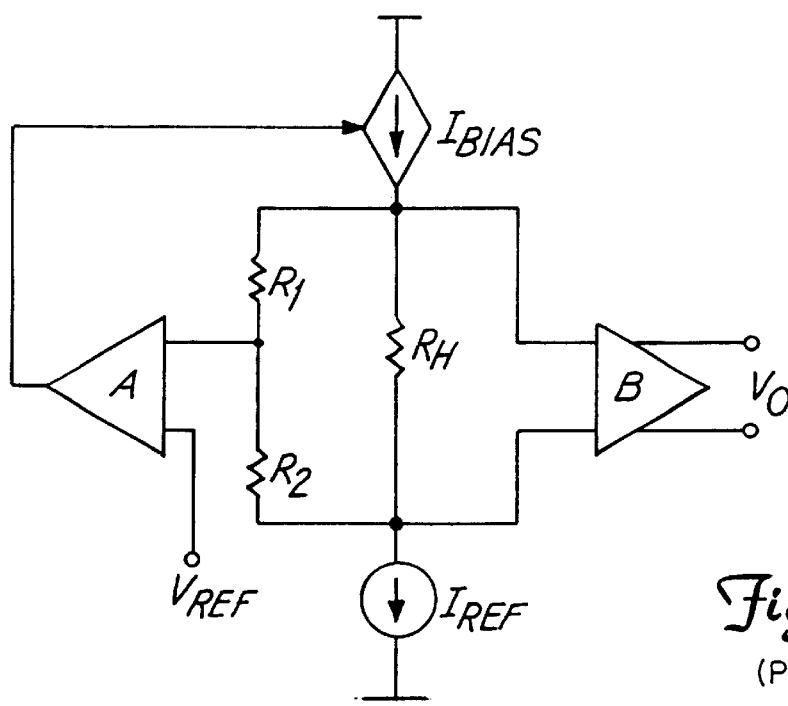
FIG. 1 is a block diagram of a CBVS preamplifier of the prior art.
Figure 2:
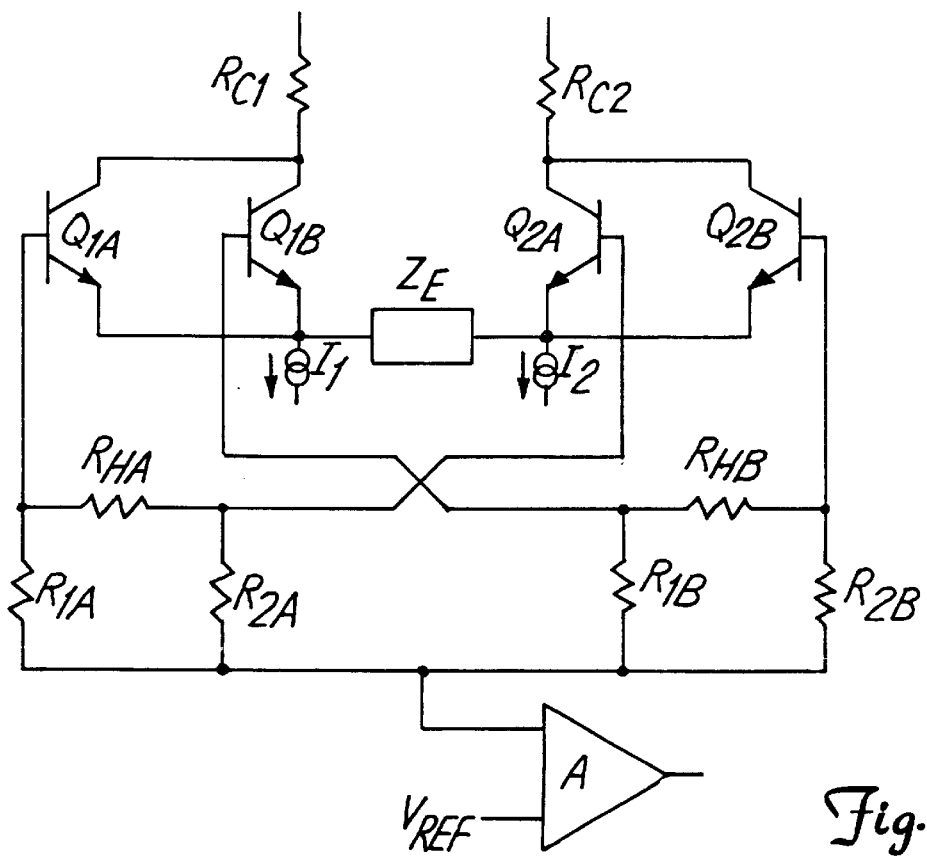
FIG. 2 is a schematic diagram illustrating a prior art CBVS preamplifier configured for two MR heads.
Figure 3:
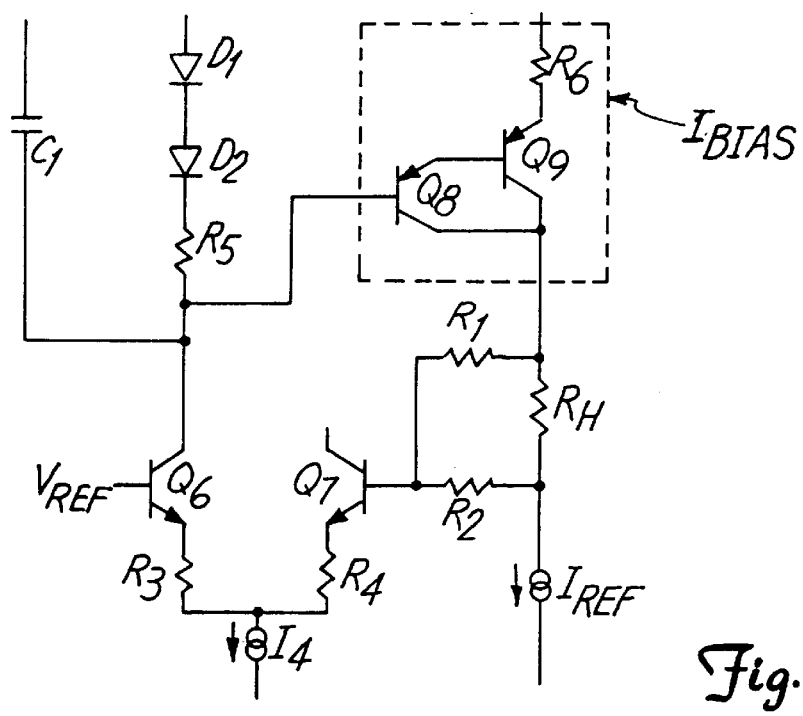
FIG. 3 is a schematic diagram illustrating a differential feedback amplifier of the prior art.

Differential feedback amplifier 18 (FIG. 7) of the present invention incorporates several advances over that of the prior art. First, the feedback loop of the current invention provides higher gain, improved stability, and greater error minimization than the prior art. Specifically, amplifier 18 symmetrically biases differential pair transistors $Q_{23}$ and $Q_{24}$, using DC shift circuit 24 and current-canceling circuit 26. Hence, the collector potentials of transistors $Q_{23}$ and $Q_{24}$ are approximately the same, i.e. two diode drops below voltage source $V_{S1}$ (not shown). In contrast, the prior art feedback amplifier (FIG. 3) lacks shift circuit 24 and current-canceling circuit 26 and therefore misperceives the feedback error. In addition, amplifier 18 includes active-load circuit 28. Circuit 28 increases amplifier gain without requiring larger supply voltages and collector resistors. It also bolsters the common-mode rejection performance of the feedback amplifier by making it less sensitive to component variations. Moreover, to ensure adequate stability, amplifier 18 includes compensation for its high gain. In particular, amplifier 18 replaces the limited degenerative arrangement of current source $I_4$ and resistors $R_3$ and $R_4$ (FIG. 3) with resistors $R_7$ and current sources $I_5$ and $I_6$, making its gain inversely proportional to resistor $R_7$. Thus, the change permits resistor $R_7$ to be arbitrarily large to stabilize the feedback loop.

Second, the present invention solves the shot noise shunting deficiency of the prior art. Unlike the integrated capacitor $C_1$ of the prior art (FIG. 3), capacitor $C_2$ of the present invention is discrete and coupled to the control terminal of bias current source $I_{BIAS}$. Because capacitor $C_2$ is discrete, it is not limited by available die area as is the integrated capacitor used in the prior art. Placing capacitor $C_2$ at the control terminal of source $I_{BIAS}$ (i.e., the base of transistor $Q_{25}$) lowers the emitter impedance of transistor $Q_{25}$, providing a better shunt for its shot noise than that provided for transistor $Q_9$ of prior art FIG. 3. For instance, selecting a capacotor $C_2$ valued at 0.05 microfarad and assuming a one-megahertz operating frequency means the shot noise of current source $I_{BIAS}$ shunts through 3 ohms as opposed to the 15-to-60 ohms of the prior art. Placing capacitor $C_2$ at the base of transistor $Q_{25}$ also permits it to serve as a compensation capacitor. In this second role, capacitor $C_2$ compensates for the heightened gain of amplifier 18 by shifting one of the poles in the transfer function of the feedback circuit. Moreover, combining resistor $R_{10}$ with capacitor $C_2$ rejects feedback noise by forming a low-pass filter. If resistor $R_{10}$ is 25 kilo-ohms and capacitor $C_2$ is 0.05 microfarad, the resulting filter cuts off at 125 hertz, well below the one-megahertz operating frequency of the preamplifier. Thus, the filter blocks noise from feedback amplifier 18 and shift circuit 24, enabling the preamplifier to better read data from a magnetic medium.

Figure 10:
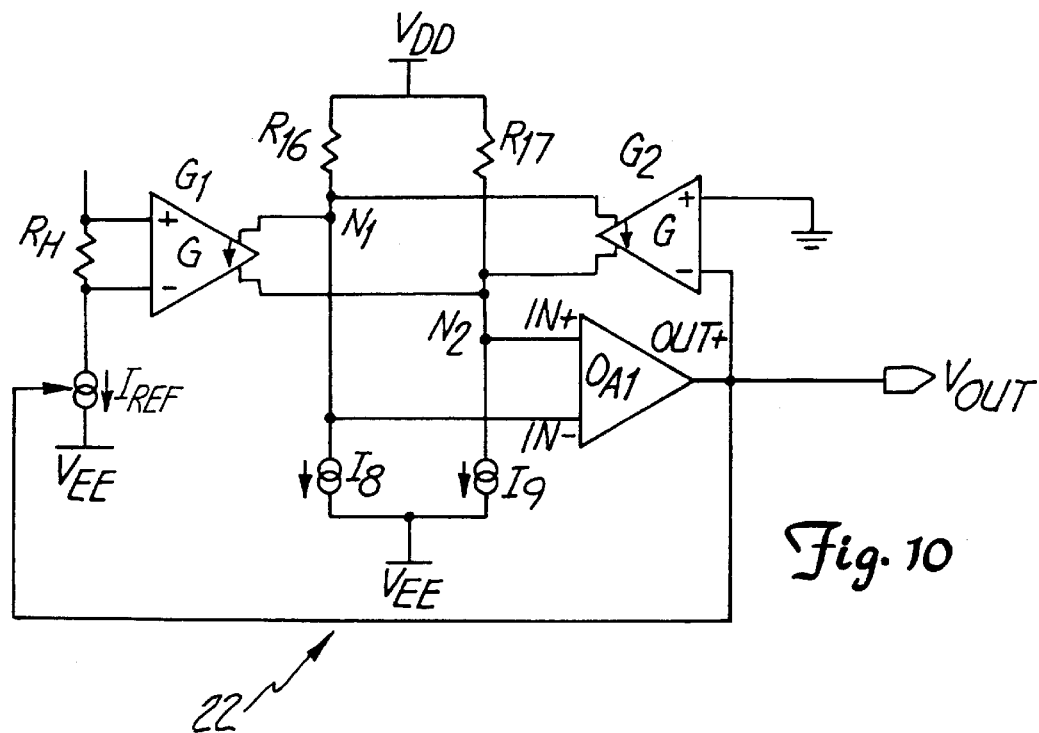
FIG. 10 is a schematic diagram of a voltage converter used in the preamplifier shown in FIG. 4.

FIG. 10 is a schematic diagram of voltage converter 22. Voltage converter 22 includes transconductance amplifiers $G_1$ and $G_2$, matched current sources $I_8$ and $I_9$, matched resistors $R_{16}$ and $R_{17}$, and operational amplifier $OA_1$. For sake of clarity, the inputs of transconductance amplifier $G_1$ are shown directly connected to MR head $R_H$. In the preferred embodiment, these inputs are multiplexed to a plurality of heads using multiplexer 16 of FIG. 4. Matched resistors $R_{16}$ and $R_{17}$ are connected in series with respective matched current sources $I_8$ and $I_9$, forming two symmetrical branches connected in parallel between voltage sources $V_{DD}$ and $V_{EE}$. Each branch includes a respective node $N_1$ and $N_2$ at the junction of its resistor and current source. The outputs of transconductance amplifiers $G_1$ and $G_2$ are connected to the nodes of the two symmetrical branches such that their output currents oppose. The nodes are also coupled to the inputs of operational amplifier $OA_1$ which has its output coupled to the negative (or inverted) input of transconductance amplifier G2 and to the control terminal of current source $I_S$ (FIG. 9). As explained above, current sink $I_{REF}$ mirrors current source $I_S$. Consequently, current sink $I_{REF}$ is controlled by controlling current source $I_S$.

In practice, transconductance amplifier $G_1$ senses the voltage across the selected head and outputs a current which disrupts the balance between the two symmetrical branches. The disruption appears as a voltage difference between the two nodes $N_1$ and $N_2$. Amplifier $OA_1$ amplifies the voltage difference, driving amplifier $G_2$ to produce an opposing current that restores the balance between the two branches. Amplifier $OA_1$ also outputs a single-ended voltage to control current sink $I_{REF}$. Accordingly, voltage converter 22 operates within a second feedback loop, enabling adaptive programming of current sink $I_{REF}$. By adjusting the bias reference to fit each of a plurality of multiplexed MR heads, the preamplifier of the present invention maintains consistent biasing irrespective of variations among the plurality of multiplexed heads.

Figure 11:
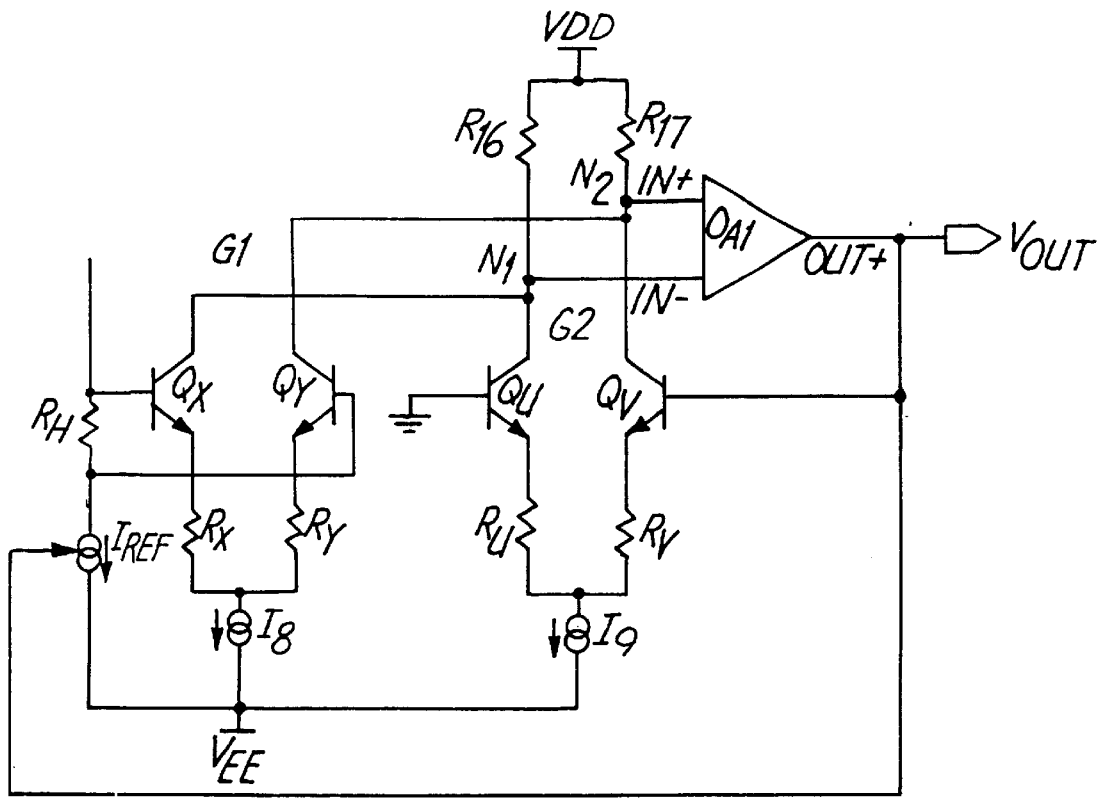
FIG. 11 is a detailed schematic diagram of the voltage converter of FIG. 10.

FIG. 11 is a more detailed schematic diagram of voltage converter 22, showing specific circuits for transconductance amplifiers $G_1$ and $G_2$. Transconductance amplifier G. comprises transistors $Q_X$ and $Q_Y$, resistors $R_X$ and $R_y$, and current source $I_8$. Transistors $Q_x$ and $Q_y$ are configured as a differential pair. Resistors $R_x$ and $R_y$ are connected between respective emitters of transistors $Q_x$ and $Q_y$ and voltage source $V_{EE}$ via current source $I_8$. The bases and collectors of transistors $Q_x$ and $Q_y$ form respective input and output terminal pairs. Similarly, transconductance amplifier $G_2$ comprises transistors $Q_u$ and $Q_v$, current source $I_9$, and resistors $R_u$ and $R_v$.

The present invention provides certain methodological advances over the prior art. The prior art biased an MR element using a current source operated according to a difference between the center voltage of the MR element and a reference voltage $V_{REF}$. The present invention advances the art by coupling a controllable current sink to the MR element and controlling it using an output voltage of the MR element.

Although the present invention has been described with reference to preferred embodiments, workers skilled in the art will recognize that changes may be made in form and detail without departing from the spirit and scope of the invention.

What is claimed is:

1. In a preamplifier for an MR element, a method of converting a differential output voltage of the MR element to a single-ended voltage, comprising:

providing a parallel circuit having first and second symmetrical branches between first and second voltage sources;

applying the differential output voltage to a first transconductance amplifier to produce a voltage imbalance between the first and second symmetrical branches;

operating a second transconductance amplifier according to the voltage imbalance to restore balance of the first and second symmetrical branches; and operating a differential amplifier to produce the single-ended voltage based on the voltage imbalance.

* * * * *

UNITED STATES PATENT AND TRADEMARK OFFICE
CERTIFICATE OF CORRECTION

PATENT NO.   : 6,341,046 B1
DATED        : January 22, 2002
INVENTOR(S)  : Douglas R. Peterson It is certified that error appears in the above-identified patent and that said Letters Patent is hereby corrected as shown below:

<u>Column 2,</u>
Line 22, delete "4,870,610", insert -- 4,879,610--

<u>Column 4,</u>
Line 18, delete "preamnplifier", insert -- preamplifier --
Line 31, delete "gun", insert -- gain --
Line 40, delete "Darlington-paire A", insert -- Darlington-paired --

<u>Column 9,</u>
Line 22, delete "capacotor", insert -- capacitor --

Signed and Sealed this

Seventeenth Day of September, 2002

*Attest:*

JAMES E. ROGAN
*Attesting Officer*   *Director of the United States Patent and Trademark Office*